US008796132B2

(12) United States Patent
Sung et al.

(10) Patent No.: US 8,796,132 B2
(45) Date of Patent: Aug. 5, 2014

(54) SYSTEM AND METHOD FOR FORMING UNIFORM RIGID INTERCONNECT STRUCTURES

(75) Inventors: Ming-Chung Sung, Taichung (TW); Yung Ching Chen, Dali (TW); Chien-Hsun Lee, Chu-tung Town (TW); Chen-Hua Yu, Hsin-Chu (TW); Mirng-Ji Lii, Sinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/539,188

(22) Filed: Jun. 29, 2012

(65) Prior Publication Data
US 2014/0004660 A1    Jan. 2, 2014

(51) Int. Cl.
*H01L 21/60* (2006.01)
*H01L 21/48* (2006.01)

(52) U.S. Cl.
CPC .................................. *H01L 21/4825* (2013.01)
USPC ........................................................... 438/611

(58) Field of Classification Search
None
See application file for complete search history.

(56) References Cited

U.S. PATENT DOCUMENTS

| 6,110,823 | A  | * | 8/2000  | Eldridge et al. ............... 438/660 |
| 6,884,707 | B1 | * | 4/2005  | Cherian ........................ 438/611 |
| 8,020,290 | B2 | * | 9/2011  | Sheats ............................. 29/842 |
| 2002/0140096 | A1 | | 10/2002 | Higgins, III |
| 2009/0166835 | A1 | | 7/2009  | Yang et al. |

* cited by examiner

*Primary Examiner* — William D Coleman
(74) *Attorney, Agent, or Firm* — Slater and Matsil, L.L.P.

(57) ABSTRACT

Disclosed herein is a system and method for mounting semiconductor packages by forming one or more interconnects, optionally, with a wirebonder, and mounting the interconnects to a mounting pad on a target package. Mounting the interconnect may comprise ultrasonically welding the interconnects to the mounting pads, and the interconnect may be mounted via a mounting node on the end of the interconnect, wherein the mounting node may be formed by an electric flame off process. The interconnects may be trimmed to one or more substantially uniform heights, optionally using a laser or contact-type trimming system, and the tails of the interconnects may be supported during trimming. A top package may be bonded on the trimmed ends of the interconnects. During mounting, a support plate may be used to support the package, and a mask maybe used during interconnect mounting.

20 Claims, 5 Drawing Sheets

SYSTEM AND METHOD FOR FORMING UNIFORM RIGID INTERCONNECT STRUCTURES

BACKGROUND

Generally, one of the driving factors in the design of modern electronics is the amount of computing power and storage that can be shoehorned into a given space. The well-known Moore's law states that the number of transistors on a given device will roughly double every eighteen months. In order to compress more processing power into ever smaller packages, transistor sizes have been reduced to the point where the ability to further shrink transistor sizes has been limited by the physical properties of the materials and processes. Designers have attempted to overcome the limits of transistor size by packaging ever larger subsystems into one chip (systems on chip), or by reducing the distance between ships, and subsequent interconnect distance.

One method used to reduce the distance between various chips forming a system is to stack chips, with electrical interconnects running vertically. This can involve multiple substrate layers, with chips on the upper and lower surfaces of a substrate. One method for applying chips to the upper and lower side of a substrate is called "flip-chip" packaging, where a substrate has conductive vias disposed through the substrate to provide an electrical connection between the upper and lower surfaces. These interposer substrates for flip chips are commonly silicon, glass or some other insulator with copper, gold or other conductors disposed in the vias through the interposer.

Through silicon vias (TSVs) are also used to create 3D integrated circuits, and are advantageous over wire bonding or other connection techniques because the technique permits a substantially higher density vias in a given amount of space, and because the length of the connections is shorter. A 3D package such as System in Package, Chip Stack Multi-Chip Module (MCM), etc. contains two or more chips (integrated circuits, ICs) stacked vertically so that they occupy less space and/or have greater connectivity. The different dies in the stack may be heterogeneous, e.g. combining CMOS logic, DRAM and III-V materials into a single IC. An alternate type of 3D package is Silicon Carrier Packaging Technology, where ICs are not stacked but a carrier substrate containing TSVs is used to connect multiple ICs together in a package. In most 3D packages, the stacked chips are wired together along their edges and this edge wiring slightly increases the length and width of the package and usually requires an interposer layer between the chips. In some 3D packages, through-silicon vias replace edge wiring by creating vertical connections through the body of the chips. The resulting package has no added length or width. Because no interposer is required, a TSV 3D package can also be flatter than an edge-wired 3D package. This TSV technique is sometimes also referred to as TSS (Through-Silicon Stacking or Thru-Silicon Stacking). A 3D integrated circuit (3D IC) is a single integrated circuit built by stacking silicon wafers and/or dies and interconnecting them vertically so that they behave as a single device. By using TSV technology, 3D ICs can pack a great deal of functionality into a small footprint.

Frequently, packages are joined using wire bonding, where a conductive wire is spot welded or soldered to a pad, and then cut and welded to a second pad. Gold is frequently used for both the bonding pads and wires in such a case, primarily due to gold's resistance to oxidation and relatively low welding temperature. Solder ball grid arrays are also a technique sometimes used to joining packages, with an array of solder balls deposited on the bonding pads of a first package, and with a second package joined at its own bonding pad sites to the first pad via the solder balls. The environment with the solder ball grid array is heated to melt the solder balls and the packages compressed to cause the solder balls to contact the pads on both packages.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely making and using uniform rigid interconnects useful in, for example, package-on-package assemblies. Other embodiments may also be applied, however, to other electrically connected components, including, but not limited to, bare chips without packaging, displays, input components, board mounting, die or component mounting, or connection packaging or mounting of combinations of any type of integrated circuit or electrical component.

The present concepts are directed to providing a system and method for creating solid interconnects of uniform height to separate, support and electrically connect one or more electrical components. Solid interconnect systems may provide a higher density of interconnects than alternative methods of packaging, and reduce the failure rate of interconnected assemblies. Solid interconnects may be used to attach, or stack multiple packages vertically, connecting the stacked packaged via redirection layer (RDL) contacts, electrical traces, mounting pads or the like.

The solid interconnects may be referred to as studs, stud bumps or nails. The nails may be mounted between two packages and be used as stand-offs for package-on-package (PoP) assemblies, where the solid nail supports an upper package when stacked on a lower, carrier package. Component packages may be one or more components mounted onto a carrier board, or substrate. While the embodiments of the solid interconnects are described herein as solid, in particularly useful embodiments, the interconnects are solidly constructed, rigid or otherwise capable of securely separating opposing packages. Additionally, while the interconnects are also described as uniform, the interconnects need not be perfectly uniform, but are ideally substantially uniform in height, or at least substantially uniform across a desired plane. For example, interconnects may be mounted on a lower package, extending upward to accept or support an upper package mounted on the interconnects. The lower package may have mounting pads arranged in virtually any topography, however, trimming the tops of each interconnect to a generally uniform height may permit mounting a top package such that each interconnect contacts a mounting pad of other connection point on the top package. Disparate groups of interconnects may also each be trimmed to a predetermined, substantially uniform height, so that packages having a non-planar mounting pad topography, or multiple packages mounted at different heights, may be advantageously mounted on the interconnects.

In particularly useful embodiments of the presented principles, a package on package assembly may be created, or a package may be mounted, using interconnects that may optionally be pre-formed, created with bulk material or created in place by extrusion or via wire from a wirebonder system. The interconnects may be optionally formed with a mounting node on the end which may be created by, for example, an electric flame off process. The interconnects may be mounted to mounting pads on a target package, via ultrasonic welding, solder paste, solder, conductive adhesive, or the like, and may be cut to a rough length.

In this manner, multiple interconnects may be mounted and then trimmed, with groups of interconnects trimmed to one or more predetermined, substantially uniform heights. Interconnects may also be mounted and trimmed one at a time, or in groups. The trimming may be done with a laser, with another non-contact-type trimming system, or with a contact-type trimming system such as a blade, abrasive or hot wire. A laser trimming system may have a cutting beam wide enough to vaporize any excess material when trimming, and trimming may take place in a single pass, or in multiple passes. The interconnects may be supported at the tails, or the non-mounted ends, during trimming. After trimming, one or more top packages may be mounted on the interconnects, with the mounting pads on the top package bonded to the trimmed ends of the interconnects. The mounting material for the interconnects, target package and bottom package may be optionally reflowed during the mounting and trimming process to permanently bond the interconnects to the mounting pads of the target package and top package.

During mounting and trimming, a support plate may support the back side of the target package, particularly to minimize flexion or distortion of the target package when mounting the interconnects using a wirebonder or pressure inducing mounting technique such as ultrasonic welding. A mask may also be used to mask the interconnect side of the target package. The mask may have openings permitting the mounting and trimming of interconnects, and the mask may support and protect the target package during the interconnect processing steps.

Figure 1A:
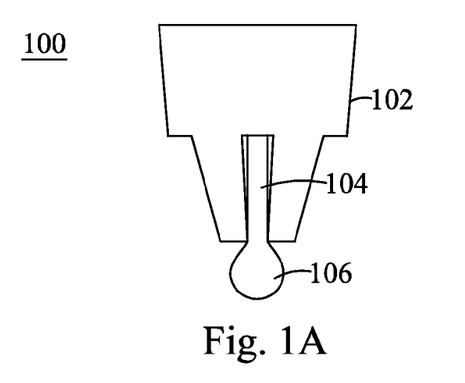
FIGS. 1A-1F are diagrams illustrating an embodiment of a method for applying and trimming a rigid interconnect.

With reference now to FIG. 1A, a first embodiment of method for applying and trimming a rigid interconnect 100 is depicted. A rigid interconnect may, in some embodiments, be formed from a wire 104 or another substantially solid material. In particularly useful embodiments, a interconnect placement system 102 may be a wirebonder system, a pick-and-place system, or the like. When using a wirebonder as the interconnect placement system 102, the wirebonder may extend some length of wire 104 and a mounting node 106 may be formed on the wire 104. One useful embodiment of the presented principles may be where an electric spark, or electric flame off, is applied to the end of the wire 104, to melt the tip of the wire 104 forming the mounting node 106. Such free air ball formation may be employed to form the mounting node 106 in situ, however the mounting node may be formed using any suitable method, including performing the interconnect 116 through extrusion, deposition, casting, milling or the like.

Figure 1B:
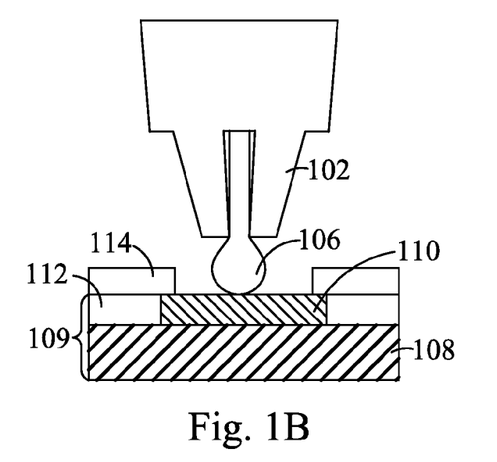

FIG. 1B illustrates application of the mounting node 106 to a mounting pad 110. A target package 109 may have a substrate 108 with one or more RDL layers applied thereon, and may include one or more mounting pads 110 separated by insulating layers 112 or the like. The interconnect 116 may be attached to the mounting pad 110 through any suitable system, including, but not limited to, ultrasonic welding, soldering, arc welding, adhesives, solder paste and solder ball reflow or the like. In a deformation type attachment system such as ultrasonic welding, the interconnect placement system 102 may be used to apply pressure and ultrasonic or electrical energy to attach the interconnect 116 to the mounting pad 110. A support plate and mask 114 may optionally be applied to the face of the target package 109 to support or protect the target package during the interconnect 116 processing.

Figure 1C:
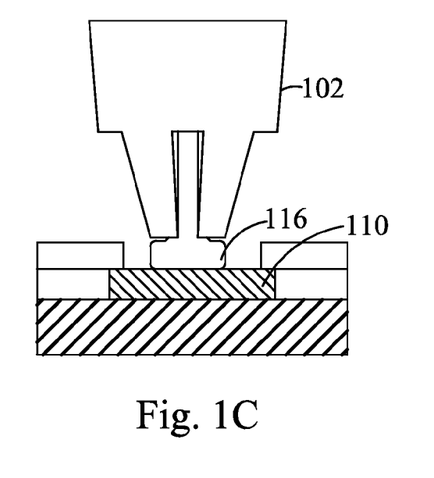

FIG. 1C illustrates an interconnect 116 attached to the mounting pad 110, with the mounting node 106 generally flattened or deformed to more completely bond with the mounting pad 110. In particular, ultrasonic welding or the like may be used in combination with pressure from the interconnect placement system 102 to deform the mounting node 106 to increase the area of contact between the mounting pad 110 and the interconnect 116. Alternatively, a preformed nterconnect 116 may be advantageously used, and that pre-formed interconnect may have a sufficiently broadened mounting node 106 such that pressure causing deformation on mounting may not be required.

Figure 1D:
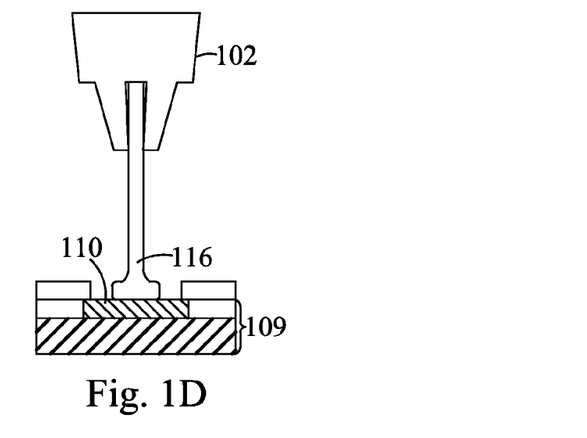

FIG. 1D illustrates an interconnect 116 prepared for trimming. In some embodiments, a tool, die, clamp or other supporting system will hold the top, or tail, end of an interconnect 116 prior to trimming to ensure the interconnect 116 does not deform or shift during trimming. In an embodiment where the interconnect placement system 102 is a wirebonder, the wirebonder may act as the supporting system, and the wirebonding head may clamp the tail end of the interconnect 116 prior to trimming. Alternatively, a wirebonder 102 may cut the interconnect 116 to rough size, and then a separate clamp or reinforcing system may hold the interconnect 116 for trimming.

Figure 1E:
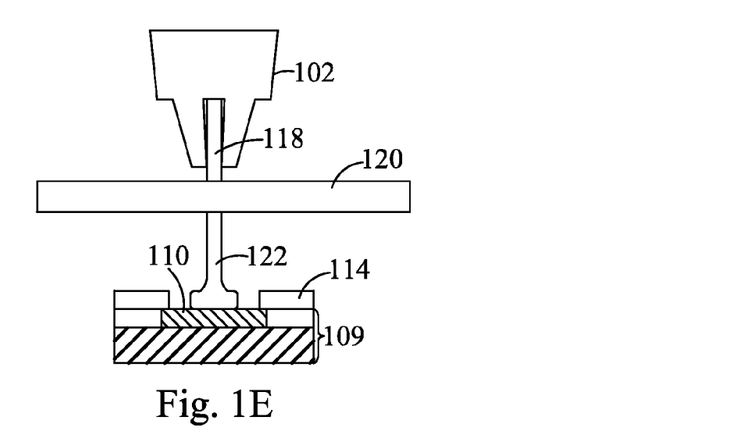

FIG. 1E illustrates trimming of an interconnect 116. In particularly useful embodiments, the trimming system 120 may be used to trim one or more interconnects 116 to separate a trimmed interconnect 122 from the excess interconnect tail 118. The trimming system 120 may advantageously employ a laser, trimming wire, blade, saw, or any other system useful for accurately trimming an interconnect 122.

Figure 1F:
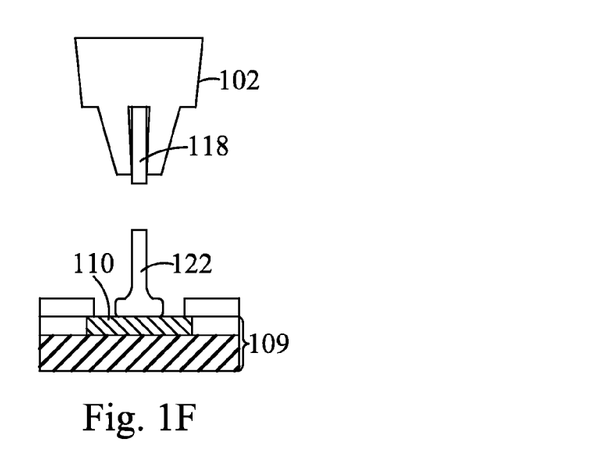

FIG. 1F illustrates a trimmed interconnect 122 separated from the interconnect tail 118. In systems where a wirebonder is used to form the interconnect and to clamp the interconnect 122 for trimming, the interconnect 122 may be formed from a continuous wire so that the wirebonder may place numerous interconnects without reloading. The interconnect tail 118 may be the remaining wirebonder wire. In embodiments where the interconnect 122 is preformed, or where the interconnect 122 is cut from another bulk material before trimming, the interconnect 122 tail may be held or clamped during trimming, and any remaining material discarded.

In some embodiments the mask 114 may be a plate having openings arranged to permit application of interconnects 122 through the mask 114 openings, with the areas of a substrate or package 109 covered by the mask 114 to protect from residue or excess interconnect tail 118 material resulting from interconnect 122 trimming.

While the foregoing figures illustrate a single interconnect 122 being trimmed, the presented principles may be advantageously used to trim multiple interconnects 122 at once. Such gang trimming may, in one embodiment, be used to bring a plurality of interconnects 122 to a substantially uniform level for mounting an upper package. In such an embodiment, an upper package may have an array of planar mounting pads, and the interconnects 122 may be attached to the mounting pads using solder paste, conductive adhesive, or solder reflow techniques. Additionally, trimming the interconnects 122 may advantageously permit the interconnects 122 to be applied to a non-planar target package and still result in a uniform level of the interconnect 122 top surfaces. By extension, trimming interconnects 122 may also compensate for interconnects that are not orthogonal to the target package, that is, interconnects that may be mounted crookedly, or not mounted perfectly flat to the target package 109 mounting pad 110. Thus, a target package 109 having mounting pads 110 at different RDL levels, or interconnects 122 applied unevenly can be compensated for prior to mounting an upper or top package.

Figure 2A:
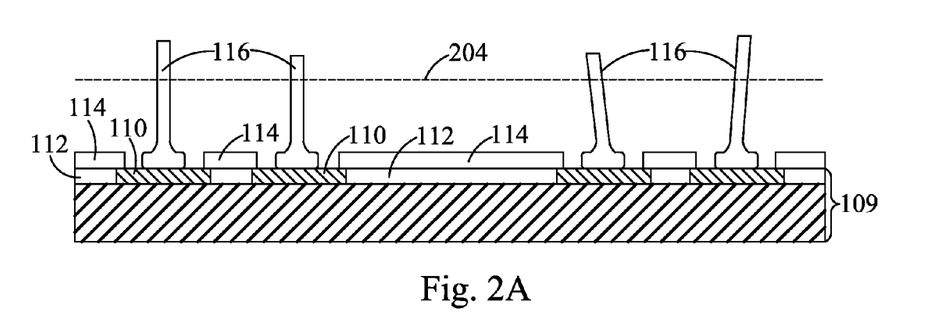
FIGS. 2A-2C are diagrams illustrating an embodiment of a method for applying and trimming multiple rigid interconnects.

FIG. 2A illustrates an embodiment of method for trimming multiple interconnects. In this embodiment, a target package 109 may have a plurality of mounting plates 110, each with an untrimmed interconnect 116 bonded thereon. Generally, the target package may have a substrate 202 with an optional insulating layer 112 disposed between the mounting pads 110. A mask 114 may be applied to the target package 109 so that the interconnects 116 protrude through openings in the mask 114.

The interconnects 116 may each protrude higher than a trimming plane 204. The interconnects 116 may then be advantageously trimmed via a trimming system 120, which may include, but is not limited to, a laser, trim wire, hot wire, abrasive, saw blade or the like. In this embodiment, with multiple untrimmed interconnects 116, it may be impractical to support the tails of each untrimmed interconnect 116 during trimming, and thus, a non-contact trimming method such as a laser may be advantageous. Alternatively, a cutting tool that does not bend or deform the interconnects 116, such as a hotwire operated well over the melting point of the interconnect material may be employed.

Figure 2B:
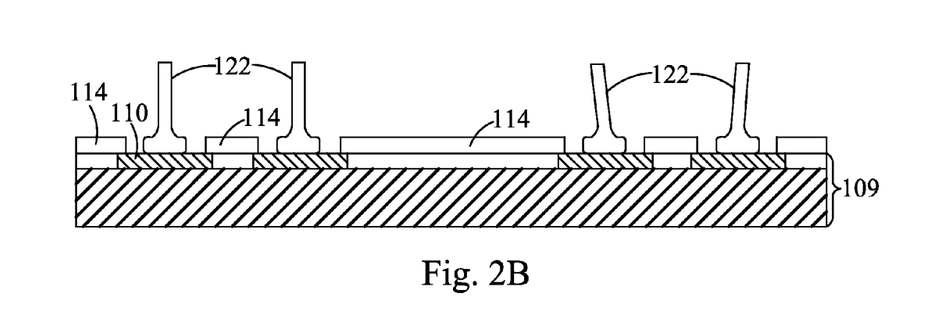
Figure 2C:
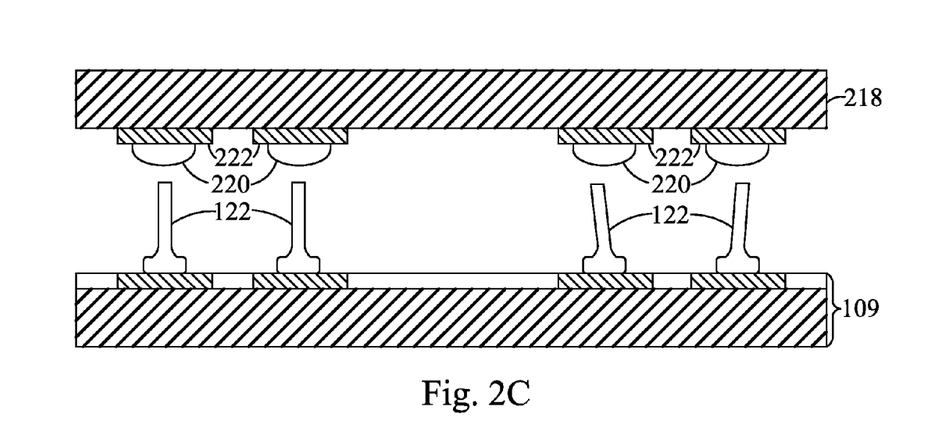

FIG. 2B illustrates a target package with trimmed interconnects 122, and FIG. 2C illustrates mounting of a top package 218 to the trimmed interconnects 122. Any mask 114 may preferably be removed after trimming the interconnects 122, but prior to mounting the top package 218. The top package 218 may have a one or more mounting pads 222 with solder balls 220 or another adhesive that can effectively hold the top package in place when placed on top of the interconnects 122.

Figure 3:
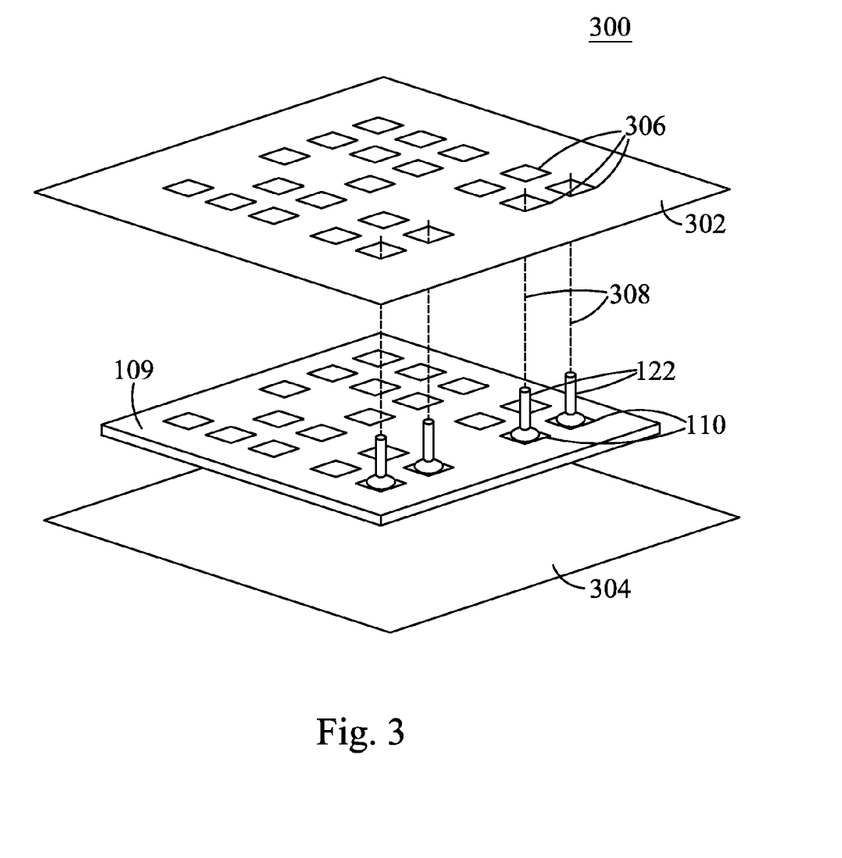
FIG. 3 is a diagram illustrating a system for masking a target package for applying and trimming rigid interconnects.

FIG. 3 illustrates a mask 302 and support plate 304 that may be advantageously used when applying or trimming solid interconnects 122. The mask 302 may be placed on the bottom package, and may have one or more openings 306 through which the target package 109 mounting pads 110 are exposed. Additionally, a support plate 304 may be used to support the target package 109 when the interconnects 116 are applied. In embodiments where a deformation type attachment system is used to apply interconnects 122 to the target package 109, a support plate 304 may assist in resisting flex in the target package when the interconnects 122 are applied.

Figure 4:
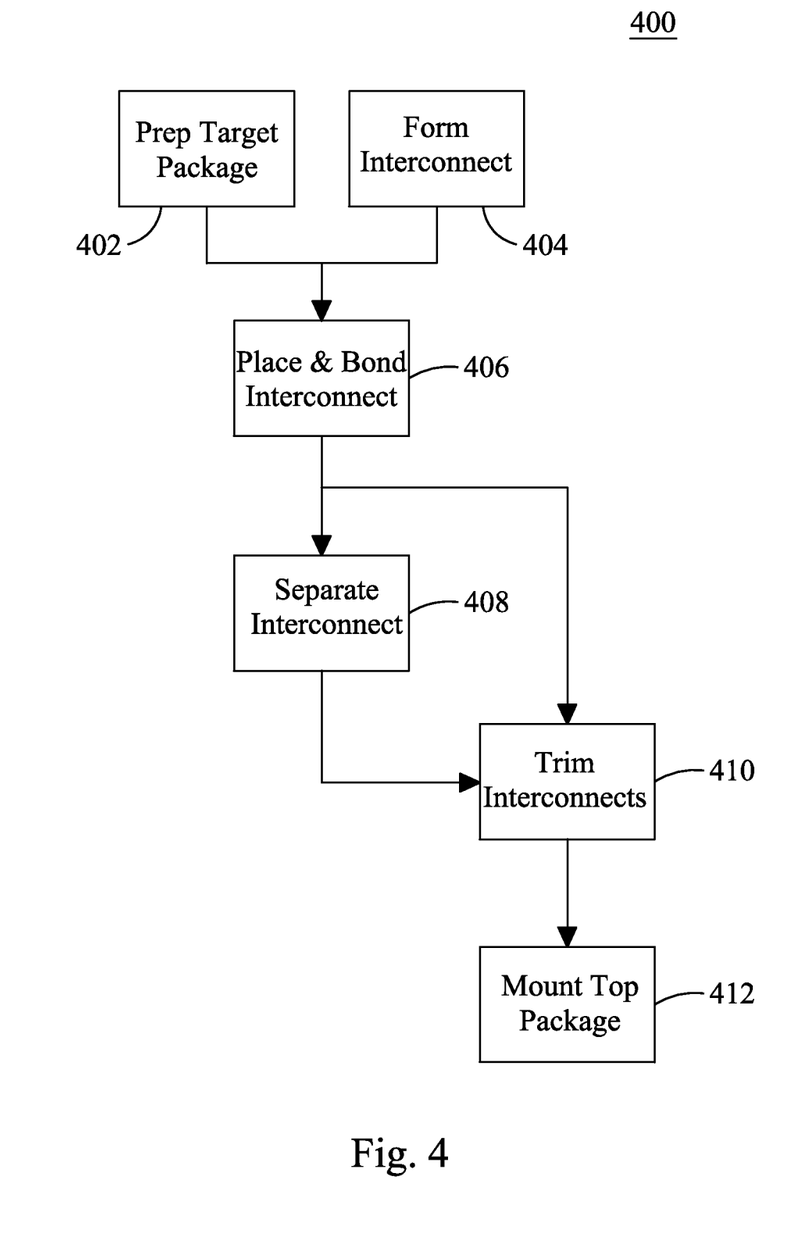
FIG. 4 is a flow diagram illustrating an embodiment of a method for applying and trimming rigid interconnects in a package-on-package arrangement.

FIG. 4 is a flow diagram illustrating an embodiment of a method for applying and trimming rigid interconnects 400 in a package-on-package arrangement. Initially, a target package 109 may be prepared in block 402 by creating mounting pads 110, applying solder paste or an organic solder preservative or the like. In one embodiment, the target package 109 may be a completed package, with housings or covers, passivation layers and the like in place before application of the mask 104, and interconnects 122 to avoid the applied interconnects 122 interfering with later packaging steps.

Interconnects 122 may also be formed in block 404 before placing and bonding to a target package 109 in block 406. The interconnects 122 may be formed as they are applied to the target package, as in a wirebonder application system. Alternatively, the interconnects 122 may be pre-formed in bulk through any suitable fabrication process.

After the target package 109 has been prepared, interconnects 122 may be placed and bonded on the target package 109. In some embodiments, the interconnects 122 may be permanently bonded, through, for example, soldering, ultrasonic welding or arc welding. Alternatively, the interconnects 122 may be placed and bonded to the target package 109 using a non-permanent bonding technique, including, but not limited to solder paste, temporary soldering, or the like.

Once placed in block 406, the interconnects may optionally be separated in block 408 from any bulk material if made in place. Thus, for example, where the interconnects 122 are formed from a continuous wire using a wirebonder, or the interconnects 122 are extruded in place, the interconnect 122 may be roughly cut, or separated from the material remaining in the interconnect placement system 102.

The interconnects 122 are trimmed in block 410. The trimming may be accomplished by trimming one, or more than one, interconnect at a time. For example, where a contact-type trimming system 120, such as a hot wire or blade, is used, a clamping or interconnect 122 tail supporting system may grasp individual interconnect 122 tails, followed by the trimming system trimming the interconnect tail supported by the tail supporting system. Skilled artisans will recognize that greater throughput maybe achieved where a tail supporting system may clamp multiple interconnect 122 tails, permitting the trimming system 120 to trim multiple tails at once. Additionally, a non-contact trimming system 120 may also trim multiple interconnect 122 tails at once. For example, a laser trimming system 120 may be configured to extend across one or more interconnects, and the laser or cutting edge may be moved across the target package 109 to trim the interconnects 122. Thus, the laser may trim multiple interconnect 122 tails in a single pass. In particularly useful embodiments of a laser trimming system 120, the laser cutting area width may be thick or wide enough to vaporize all of the interconnect 122 tail extending above a predetermined height, leaving no excess material. Alternatively, a laser will at least vaporize part of the excess interconnect 122 material, and permit the remaining excess material to melt and flow onto the interconnect 122, leaving the interconnect 122 at the desired height.

The placement and trimming, or trimming alone, may also be performed in stages. Thus, a trimming system 120 may trim one or more interconnects to be uniform on a first plane, and then trim other interconnects to be uniform across a different plane at a different height. Such an embodiment may be useful where multiple packages are mounted to a single target package 109, or there a single top package 218 has non-planar mounting pads. In a bulk trimming system, such as a laser trimming system 120, interconnects 122 maybe placed and bonded as in block 406 and then trimmed as in block 410. These block 406 and 410 may be repeated one or more times, trimming the interconnects 122 at the same height as the first group already trimmed, or at a different height for each trimming pass. Additionally, another embodiment may have the trimming system cutting interconnects 122 at different heights during the same trim pass, as in block 410, permitting placement of all the interconnects 122, and trimming to multiple heights using a single trim pass.

Once the interconnects 122 are trimmed in block 410, one or more top packages 218 may be mounted on the interconnects 122. One embodiment of the presented principles may be where the interconnects 122 have substantially flat ends to provide superior contact with the mounting pads 222.

Any final interconnect 122 processing may also be performed at this stage as well. For example, in one embodiment, any solder attaching the interconnects 122 to the target package 109 or top package 218 may be reflowed to permanently bond the interconnects 122. This particular embodiment may be useful where laser trimming is used, as the laser applies little force to the interconnects 122 as they are trimmed, and the interconnects may be placed and initially bonded using a non-permanent bonding method that causes less pad deterioration or oxidation. Furthermore, another embodiment may further comprise applying an underfill between the target package 109 and top package 218.

Although the present embodiments and their advantages have been described in detail, it should be understood that various changes, substitutions and alterations can be made herein without departing from the spirit and scope of the disclosure as defined by the appended claims. It will be readily understood by those skilled in the art that many of the features and functions discussed above can be implemented using a variety of materials and orders to the processing steps. For example, interconnects may be virtually any shape, as long as they are rigid or otherwise capable of securely separating opposing packages. Interconnects may also be any conductive material, or even a semiconductor material where such material is called for. As another example, it will be readily understood by those skilled in the art that many of the steps for creating a package-on-package structure may be performed in any advantageous order while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, apparatuses, manufacture, compositions of matter, means, methods, or steps.

What is claimed is:

1. A method for creating a package-on-package assembly comprising:
   providing a target package having one or more mounting pads disposed on a first side of the target package;
   forming one or more interconnects comprising a first material, each interconnect having a mounting node integrally formed at a first end and comprising the first material;
   mounting each of the one or more interconnects to a mounting pad by attaching the mounting node to the mounting pad; and
   trimming the one or more interconnects to a predetermined height using a laser.

2. The method of claim 1, wherein the mounting comprises ultrasonically welding the interconnects to the mounting pads.

3. The method of claim 1, wherein the interconnect is formed by a wirebonding system, and the mounting node is formed by an electric flame off process applied to the first end.

4. The method of claim 1, wherein two or more interconnects are trimmed in the same pass of the laser, wherein the interconnects are trimmed to a substantially uniform height.

5. The method of claim 1, further comprising supporting each interconnect at the interconnect tail during trimming.

6. The method of claim 1, further comprising mounting at least one top package to the assembly by bonding mounting pads on the top package to the at least one interconnect.

7. The method of claim 1, wherein a width of the laser is wider than a distance between a tallest interconnect and the predetermined height, the laser vaporizing the interconnect above the predetermined height.

8. The method of claim 1, further comprising applying a mask to the first side of the target package, the mask having a plurality of openings configured to permit the mounting of the one or more interconnects through the plurality of openings.

9. A method for mounting semiconductor package comprising: providing a target package having one or more mounting pads disposed on a first side of the target package;
   applying a mask to the first side of the target package, the mask having a plurality of openings;
   mounting each of one or more interconnects comprising a first material to the mounting pads through a respective one of the plurality of openings in the mask, each of the one or more interconnects having a mounting node comprising the first material and disposed at a first end of a first portion of the interconnect, wherein each mounting node has a mounting surface disposed nearest the respective mounting pad after mounting, the mounting surface having a width wider than a width of the first portion of the respective interconnect;
   cutting the one or more interconnects to a rough length;
   trimming the one or more interconnects to a predetermined and substantially uniform height; and
   mounting at least one top package to the target package by bonding mounting pads on the top package to the one or more interconnects.

10. The method of claim 9, further comprising supporting the target package, during mounting of the interconnects, with a support plate on second side of the target package opposite the first side.

11. The method of claim 9, further comprising forming the interconnects with a wirebonding system and supporting the interconnect during the mounting with the wirebonding system.

12. The method of claim 9, wherein the trimming is performed using a laser, wherein the width of the laser is wider than a distance between the tallest interconnect and the predetermined height, the laser vaporizing the interconnect above the predetermined height.

13. The method of claim 9, wherein mounting the interconnect to the mounting pad comprises bonding the end of a wire to the mounting pad and supporting the wire with a wirebonding system while trimming the interconnect.

14. The method of claim 11, further comprising forming the mounting node by an electric flame off process.

15. The method of claim 13, wherein the trimming is performed using a contact-type trimming system to trim the supported wire.

16. A method for attaching a plurality of semiconductor devices comprising:

providing a target package having one or more mounting pads;

applying a mask to a first side of the target package, the mask having a plurality of openings;

forming one or more interconnects in place on each of the mounting pads; mounting each of the one or more interconnects to each mounting pad through the openings by bonding a first end of the interconnect to the mounting pads, the first end of the interconnect of a same material as the interconnect, wherein the first end of the interconnect deforms during the mounting;

trimming each interconnect to a height selected from a group of predetermined heights and to accept one or more top packages; and mounting the one or more top packages to the target package by bonding mounting pads on the top package to the at least one interconnect.

17. The method of claim 16, further comprising:
supporting the target package, during mounting of the interconnects, with a support plate on a second side of the target package opposite the first side.

18. The method of claim 16, further comprising:
forming the interconnects with a wirebonding system;
bonding the end of a wire to the mounting pad; and
supporting the wire with the wirebonding system while trimming the wire.

19. The method of claim 16, wherein forming the interconnects comprises further forming an interconnect having a mounting node at an end, and wherein mounting each of the one or more interconnects comprises attaching the mounting node to the mounting pads.

20. The method of claim 16, wherein the interconnects are trimmed to at least two different heights.

* * * * *